(12) United States Patent
Osada et al.

(10) Patent No.: US 6,736,703 B2
(45) Date of Patent: May 18, 2004

(54) CUTTING APPARATUS AND CUTTING METHOD

(75) Inventors: Michio Osada, Kyoto (JP); Masataka Takehara, Kyoto (JP); Makoto Matsuo, Kyoto (JP)

(73) Assignee: Towa Corporation, Kyoto (JP)

( * ) Notice: Subject to any disclaimer, the term of this patent is extended or adjusted under 35 U.S.C. 154(b) by 55 days.

(21) Appl. No.: 10/104,198

(22) Filed: Mar. 20, 2002

(65) Prior Publication Data

US 2002/0160695 A1 Oct. 31, 2002

(30) Foreign Application Priority Data

Apr. 25, 2001 (JP) ......................... 2001-126910

(51) Int. Cl.[7] .............. B24B 1/00; B24B 7/00
(52) U.S. Cl. .............. 451/28; 451/41; 451/120; 451/138; 451/171; 125/16.01; 125/19; 83/490
(58) Field of Search ............. 125/13.01, 16.01, 125/19; 83/490; 451/41, 121, 138, 159, 171, 357

(56) References Cited

U.S. PATENT DOCUMENTS

| | | | | |
|---|---|---|---|---|
| 4,091,698 A | * | 5/1978 | Obear et al. ............... 83/34 |
| 4,094,102 A | * | 6/1978 | Lauze et al. ............... 451/121 |
| 4,339,895 A | * | 7/1982 | Fivian ...................... 451/47 |
| 4,441,534 A | * | 4/1984 | Wilson .................... 144/24.12 |
| 4,970,927 A | * | 11/1990 | Benuzzi ..................... 83/875 |
| 5,586,929 A | * | 12/1996 | Butcher et al. ........... 451/213 |
| 5,679,054 A | * | 10/1997 | Chun et al. .................. 451/9 |
| 2002/0083812 A1 | * | 7/2002 | Lanzer ...................... 83/490 |

* cited by examiner

Primary Examiner—Timothy V. Eley
(74) Attorney, Agent, or Firm—W. F. Fasse; W. G. Fasse (57) ABSTRACT

A cutting blade is fixed on a shaft that rotates about its shaft center, and that is linearly advanced by an advancing movement. The shaft's center further revolves with a small radius of revolution at a rapid predetermined rate of revolution greater than the rate of advancing movement. Thus the blade is pressed against and cuts a substrate and produces chips, and the blade is intermittently disengaged from the substrate whereby the chips move in the direction in which the blade rotates to be removed from between the cutting edge of the blade and the substrate. This reduces working resistance, enhances working efficiency, and prevents the blade surface from having significant frictional heat. Furthermore, the generated frictional heat can readily dissipate and the blade can thus have a long life.

25 Claims, 6 Drawing Sheets

CUTTING APPARATUS AND CUTTING METHOD

BACKGROUND OF THE INVENTION

1. Field of the Invention

The present invention relates to apparatuses and methods using a tool such as a blade to cut a workpiece.

2. Description of the Background Art

Conventionally, silicon substrates, ceramic substrates, printed circuit, boards (hereinafter generally referred to as "substrates") and silicon ingot, and any other similar workpieces that can readily chip are cut with a rotating blade provided in the form of a disc and containing abrasive grains. In this case is used an apparatus referred to as a dicer, a slicer or the like provided with the blade. These apparatuses are used to cut a substrate, as follows:

A rotating blade can be moved to a substrate fixed on a stage or the stage with the substrate fixed thereon can be moved to the rotating blade to bring the substrate and the rotating blade into contact and thus cut the substrate.

In the above conventional cutting process, however, if the blade is rotated at an increased rate of rotation or its peripheral speed is increased to more efficiently cut the substrate, chips generated in the cutting process are insufficiently removed and the blade thus receives an increased working resistance from the substrate. Therefore the substrate is cut inefficiently and friction also increases the blade's surface temperature and thus reduces the blade's life.

Furthermore, the increased working resistance may result in the cut workpiece having burrs, since the workpiece may still have a portion thereof remaining that should have completely been removed. In particular, if a silicon substrate is cut to provide a semiconductor chip for a chip size package (CSP) and the chip has burrs, the chip may fail to be mounted on a PCB printed circuit board) snugly and by extension may introduce defective connection. Such burrs thus impair the CSP in reliability.

SUMMARY OF THE INVENTION

The present invention contemplates cutting apparatuses capable of providing enhanced working efficiency and reducing burrs and also increasing the life of a blade, and methods thereof.

The above object is achieved by the present invention in one aspect providing a cutting apparatus including: a fixture device or means for fixing a workpiece thereto; cutting means for cutting the workpiece, including a blade rotating around a shaft's center and thus contacting the workpiece to cut the workpiece; a drive mechanism or means for moving the blade and the workpiece at a predetermined relative rate of movement to allow the blade and the workpiece to contact each other; and an oscillation mechanism or means for oscillating the shaft's center at a predetermined rate of oscillation in a plane identical to a plane in which the blade cuts the workpiece, wherein the rate of oscillation is greater than the relative rate of movement.

Thus the center of the shaft of the rotating blade can provide a rapid, small oscillation at the predetermined rate of oscillation greater than the relative rate of movement, while the blade can move and thus cut the workpiece fixed to the fixture device. Thus, while it travels a distance, the blade repetitively contacts the workpiece and is disengaged therefrom more frequently. Therefore, the workpiece being cut exerts a decreased working resistance because the workpiece contacts the blade for shorter periods of time and is also out of contact with the blade for certain periods of time.

Furthermore in the present apparatus in the first aspect the oscillation mechanism may revolve the shaft's center around a center of a predetermined revolution at a predetermined rate of rotation with a predetermined radius of rotation in a predetermined direction of rotation to oscillate the shaft's center.

Furthermore in the present apparatus in the first aspect the blade and the shaft's center may rotate in the same direction.

Thus the rate of rotation of the shaft's center can accelerate the blade's peripheral speed relative to the workpiece to cut the workpiece more efficiently.

Furthermore in the present apparatus in the first aspect the blade and the shaft's center may rotate in opposite directions.

Furthermore in the present apparatus in the first aspect the oscillation mechanism may reciprocate the shaft's center, as predetermined, to oscillate the shaft's center.

Furthermore in the present apparatus in the first aspect the oscillation mechanism may move the shaft's center in a predetermined ellipse to oscillate the shaft's center.

Furthermore in the present apparatus in the first aspect the oscillation mechanism may utilize a piezoelectric effect of a piezoelectric element to oscillate the shaft's center.

Furthermore in the present apparatus in the first aspect the oscillation mechanism may composite a reciprocating oscillation having one direction and a reciprocating oscillation having another direction different from the one direction together to oscillate the shaft's center.

Furthermore the present invention in a second aspect provides a cutting apparatus including: a fixture device or means for fixing a workpiece thereto; cutting means for cutting the workpiece including a blade rotating around a shaft's center and thus contacting the workpiece to cut the workpiece; a drive mechanism or means for moving the blade and the workpiece at a predetermined relative rate of movement to allow the blade and the workpiece to contact each other; and an oscillation mechanism or means for oscillating the fixture device at a predetermined rate of oscillation in a plane identical to a plane in which the blade cuts the workpiece, wherein the rate of oscillation is greater than the relative rate of movement.

Thus the fixture device can provide a rapid, small oscillation at the predetermined rate of oscillation greater than the relative rate of movement, while the blade can move and thus cut the workpiece fixed to the fixture device. Thus, while it travels a distance, the blade repetitively contacts the workpiece and is disengaged therefrom more frequently. Therefore, the workpiece being cut exerts a decreased working resistance because the workpiece contacts the blade for shorter periods of time and is also out of contact with the blade for certain periods of time.

Furthermore in the present apparatus in the second aspect the oscillation mechanism may revolve the fixture device around a center of a predetermined revolution at a predetermined rate of rotation with a radius of rotation in a direction of rotation to oscillate the fixture device.

Furthermore, in the present apparatus in the second aspect the blade and the fixture device may rotate in the same direction.

Thus the rate of rotation of the fixture device can accelerate the blade's peripheral speed relative to the workpiece to cut the workpiece more efficiently.

Furthermore in the present apparatus in the second aspect the blade and the fixture device may rotate in opposite directions.

Furthermore in the present apparatus in the second aspect the oscillation mechanism may reciprocate the fixture device, as predetermined, to oscillate the fixture device.

Furthermore in the present apparatus in the second aspect the oscillation mechanism may move the fixture device in a predetermined ellipse to oscillate the fixture device.

Furthermore in the present apparatus in the second aspect the oscillation mechanism may utilize a piezoelectric effect of a piezoelectric element to oscillate the fixture device.

Furthermore in the present apparatus in the second aspect the oscillation mechanism may composite a reciprocating oscillation having one direction and a reciprocating oscillation having another direction different from the one direction together to oscillate the fixture device.

To achieve the above object the present invention in a first aspect provides a method using a blade rotating around a shaft's center to cut a workpiece fixed to fixture device, including the steps of: oscillating the shaft's center at a predetermined rate of oscillation in a plane identical to a plane in which the blade cuts the workpiece; moving the blade and the workpiece at a predetermined relative rate of movement; and bringing the blade and the workpiece into contact with each other to cut the workpiece, wherein in the step of oscillating, the rate of oscillation is greater than the relative rate of movement.

Thus the center of the shaft of the rotating blade can provide a rapid, small oscillation at the predetermined rate of oscillation greater than the relative rate of movement, while the blade can move and thus cut the workpiece fixed to the fixture device. Thus, while it travels a distance, the blade repetitively contacts the workpiece and is disengaged therefrom more frequently. Therefore, the workpiece being cut exerts a reduced working resistance because the workpiece contacts the blade for shorter periods of time and is also out of contact with the blade for certain periods of time.

Furthermore in the present method in the first aspect the step of oscillating may include revolving the shaft's center around a center of a predetermined revolution at a predetermined rate of rotation with a predetermined radius of rotation in a predetermined direction of rotation to oscillate the shaft's center.

Furthermore the present invention in a second aspect provides a method using a blade rotating around a shaft's center to cut a workpiece fixed to fixture device, including the steps of: oscillating the fixture device at a predetermined rate of oscillation in a plane identical to a plane in which the blade cuts the workpiece; moving the blade and the workpiece at a predetermined relative rate of movement; and bringing the blade and the workpiece into contact with each other to cut the workpiece, wherein in the step of oscillating, the rate of oscillation is greater than the relative rate of movement.

Thus the fixture device can provide a rapid, small oscillation at the predetermined rate of oscillation greater than the relative rate of movement, while the blade can move and thus cut the workpiece fixed to the fixture device. Thus, while it travels a distance, the blade repetitively contacts the workpiece and is disengaged therefrom more frequently. Therefore, the workpiece being cut exerts a reduced working resistance because the workpiece contacts the blade for shorter periods of time and is also out of contact with the blade for certain periods of time.

Furthermore in the present method in the second aspect the step of oscillating may include revolving the fixture device around a center of a predetermined revolution at a predetermined rate of rotation with a predetermined radius of rotation in a predetermined direction of rotation to oscillate the fixture device.

Furthermore in the present method in the first or second aspect in the step of oscillating the direction in which the blade rotates around the shaft's center may be identical to the direction in which the shaft's center or the fixture device rotates.

With the rate of rotation the blade and the workpiece in a vicinity of a location allowing them to contact each other can move in opposite directions constantly opposite each other. This can increase the blade's peripheral speed relative to the workpiece to cut the workpiece more efficiently.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

The present invention in a first embodiment provides a cutting apparatus and method, as will be described hereinafter with reference to FIGS. 1–3.

Figure 1:
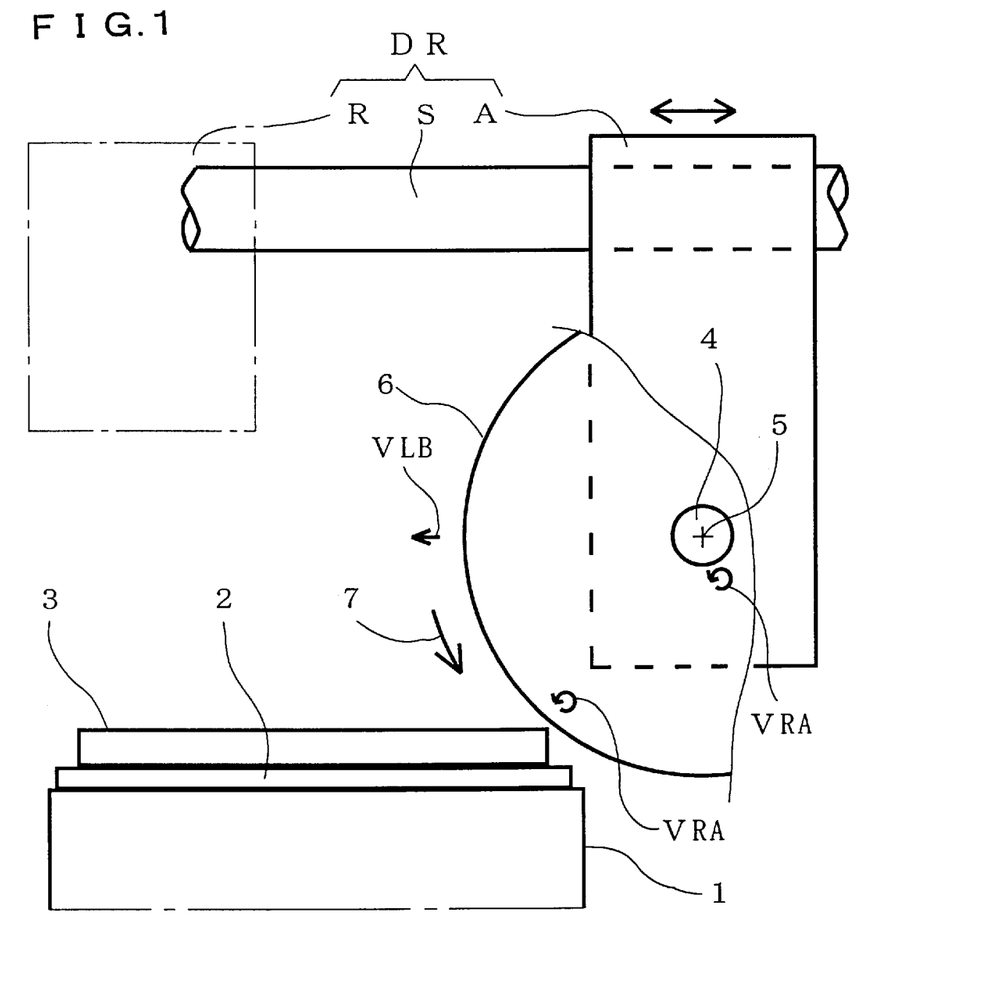
FIG. 1 shows a cutting apparatus of the present invention in a first embodiment, illustrating a main portion thereof with a blade cutting a substrate, as seen in a partial front view.

FIG. 1 shows a cutting apparatus in the present embodiment, illustrating a main portion with a blade cutting the substrate, as seen in a partial front view.

In the present embodiment the apparatus, as shown in FIG. 1, includes a stage 1 fixed to the cutting apparatus and holding a workpiece, an adhesive tape 2 having an adhesive layer on each side and affixed on a surface of stage 1 serving to hold the workpiece, and a substrate formed for example of silicon and fixed to stage 1 by adhesive tape 2.

Furthermore in the present embodiment the apparatus also includes a shaft 4 rotating at a predetermined peripheral speed as a main shaft (not shown) rotates. Shaft 4 rotates around a virtually indicated, shaft's center 5. Center 5 itself is rotated by a mechanism (not shown) at a predetermined rate of rotation VRA with a small radius of rotation rapidly.

Furthermore in the present embodiment the apparatus also includes a rotative blade 6 fixed to shaft 4 and containing abrasive grains. In the figure an arrow 7 indicates a direction in which blade 6 rotates around center 5. Furthermore, blade 6 linearly, horizontally moves at a rate of movement VLB while it rotates around center 5 once.

In the present embodiment the apparatus has rate VRA set to be greater in magnitude than rate VLB and also having a predetermined ratio to rate VLB.

Herein a mechanism A holds a cylinder rotation mechanism (indicated in FIG. 3 by a reference numeral 14), as described hereinafter, to indirectly hold shaft 4. Mechanism A is attached to a ball screw S and moves rightwards and leftwards, as seen in the figure, as ball screw S rotates. Mechanism R rotates ball screw S and it is provided for example in the form of a motor. Mechanism A, ball screw S and mechanism R together configure a drive mechanism DR.

The FIG. 1 apparatus operates, as described hereinafter.

Initially, shaft 4 rotates around center 5 in the predetermined direction 7 (counter-clockwise in FIG. 1), while center 5 rotates at the predetermined rate of rotation VRA with a small radius of rotation rapidly. Thus blade 6 rotates around center 5 in direction 7 to allow its periphery or cutting edge to have a constant peripheral speed while the exact blade 6 rotates around a center of a predetermined revolution at the predetermined rate VRA with a small radius of rotation rapidly to provide oscillation, i.e., it revolves to provide oscillation while it rotates.

To completely cut substrate 3 in the direction of the thickness of the substrate, center 5 is rotated with blade 6 having a lower end positioned below the bottom plane of substrate 3 fixed on stage 1. Furthermore, to increase the peripheral speed of blade 6 relative to substrate 3 and facilitate removing chips produced by cutting the substrate, center 5 is preferably rotated in the same direction as direction 7.

Blade 6 is then driven by mechanism DR to horizontally move at the predetermined rate VLB leftwards, as seen in FIG. 1, to contact substrate 3. The abrasive grains contained in blade 6 act to cut substrate 3 to form a groove in a top surface of substrate 3 to provide a notch reaching a bottom plane of substrate 3. Blade 6 then horizontally moves leftwards and finally cuts substrate 3 from the top plane to the bottom plane from the right to the left, as seen in FIG. 1.

In the present embodiment the apparatus and method is characterized in that center 5 rotates at rate VRA greater than rate VLB and also having a predetermined ratio to rate VLB, that center 5 rotates with a radius of rotation set to have a prescribed value relative to rate VLB, and that center 5 rotates in the same direction as direction 7.

For example, if blade 6 rotating once moves horizontally at rate VLB ($\mu$m/rotation), then, with the material(s) of substrate 3 and the size of chips produced therefrom taking into consideration, center 5 while blade 6 rotates once has a rate of rotation VRA ($\mu$m/rotation) and a radius of rotation, set as follows:

Initially, rate VRA is set to have a value larger than rate VLB and also having a predetermined ratio to rate VLB. Furthermore, the center 5 radius of rotation is set to have a predetermined value relative to rate VLB.

Thus, blade 6 is moving and thus cutting substrate 3 at rate VLB, while center 5 rotates at rate VRA, greater than rate VLB, with a small radius of rotation rapidly, and blade 6 as it travels a distance repetitively contacts and is disengaged from substrate 3 more frequently. As such, a workpiece being cut provides a working resistance decreasing as the workpieces contacts the blade for shorter periods of time and is also out of contact with the blade.

In the present embodiment the apparatus and method acts, as will now be described in detail with reference to FIGS. 2A and 2B.

Figure 2A:
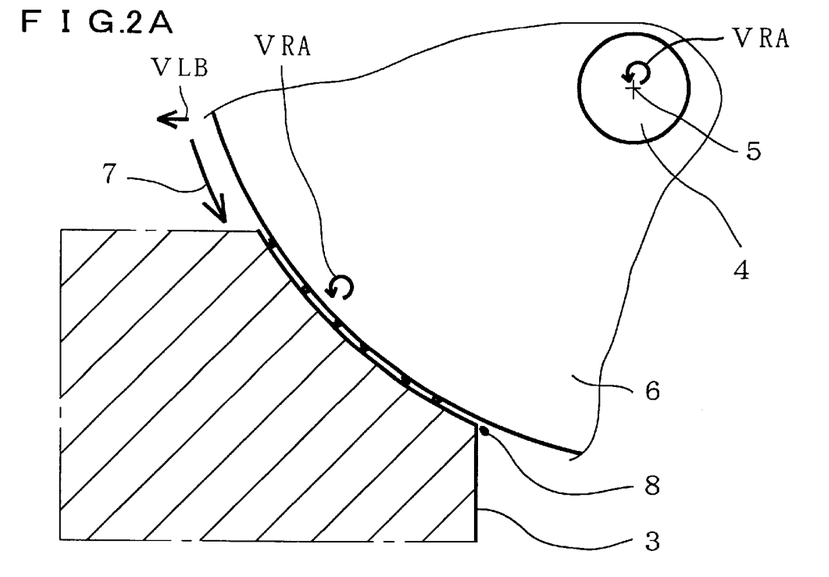
FIGS. 2A and 2B show a cutting apparatus of the present invention in the first embodiment and a method thereof, illustrating how it acts when a blade cutting a substrate is pressed against the substrate and disengaged therefrom, respectively, as seen in a partial cross section.
Figure 2B:
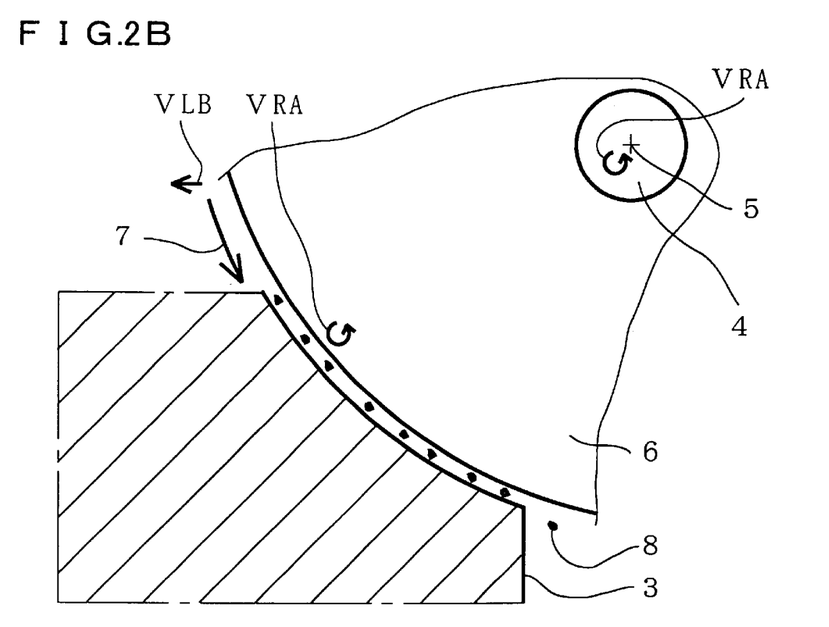

FIGS. 2A and 2B show the apparatus and method of the present embodiment, illustrating in a partial cross section how it acts when the blade cutting a substrate is pressed against the substrate and disengaged therefrom, respectively.

Initially, with reference to FIG. 2A, shaft 4 has center 5 rotating at rate VRA. Shaft 4 thus presses against substrate 3 in the same direction as direction 7 the cutting edge of blade 6 moving at rate VLB while rotating around center 5 in direction 7. The abrasive grains contained in blade 6 thus act to cut substrate 3 and produce chips 8. Water (not shown) is supplied in a vicinity of the blade's cutting edge to move chips 8 in direction 7 and thus remove chips 8 from between the cutting edge and a surface of substrate 3. However, blade 6 having its cutting edge pressed against substrate prevents chips 8 from being removed sufficiently.

Then, as shown in FIG. 2B, center 5 continues to rotate at rate VRA. Shaft 4 disengages from substrate 3 the cutting edge of blade 6 moving at rate VLB while rotating around center 5 in direction 7. Herein if center 5 is associated with a radius of rotation appropriately set relative to rate VLB the blade's cutting edge and substrate 3 are sufficiently spaced. Furthermore, rate VRA acts to pull up from substrate 3 chips 8 moving in direction 7 and thus remove and discharge chips 8 in direction 7. All of this facilitates moving chips 8 in direction 7 together with the water and thus removing chips 8 from between the cutting edge and a surface of substrate 3. Blade 6 cutting substrate 3 can be free from significant working resistance.

Then, with reference to FIG. 2A, center 5 continues to rotate at rate VRA. Shaft 4 thus presses the cutting edge of blade 6 against substrate 3 in the same direction as direction 7. The abrasive brains contained in blade 6 thus acts to cut substrate 3 and produce chips 8.

Then, similarly, the step of pressing the cutting edge of blade 6 against substrate 3 to cut substrate 3 and the step of disengaging the cutting edge of blade 6 from substrate 3 to remove chips 8 are repeated.

Thus in the method of the present embodiment chips 8 together with the water supplied for the cutting process can readily be moved in direction 7 and thus removed from between the cutting edge of blade 6 and a surface of substrate 3. Chips 8 thus hardly prevents blade 6 from cutting a workpiece. Blade 6 can thus be free from significant working resistance.

Secondly, the step of bringing blade 6 into contact with substrate 3 to cut substrate 3 is repeated intermittently. The workpiece can thus contact the blade for a reduced period of time and also be out of contact with the blade. As such, if blade 6 is rotated at increased rates, it can still be free from sufficient working resistance and thus rapidly and hence more efficiently cut substrate 3.

Furthermore the reduced working resistance can contribute to reduced frictional heat generated when blade 6 contacts substrate 3. In addition when blade 6 is out of contact with substrate 3 the generated frictional heat is removed from blade 6 through the water supplied for the cutting process. Blade 6 can thus have a surface hardly heated and it can thus be increased in longevity.

Furthermore, with the reduced working resistance, substrate 3 after it is cut can be free of significant burrs. As such, if a semiconductor chip formed by cutting a silicon substrate is used to fabricate a chip size package (CSP), the semiconductor chip can be mounted snugly to enhance the reliability of the CSP.

The present embodiment provides the cutting apparatus, as will be described hereinafter with reference to FIG. 3.

Figure 3:
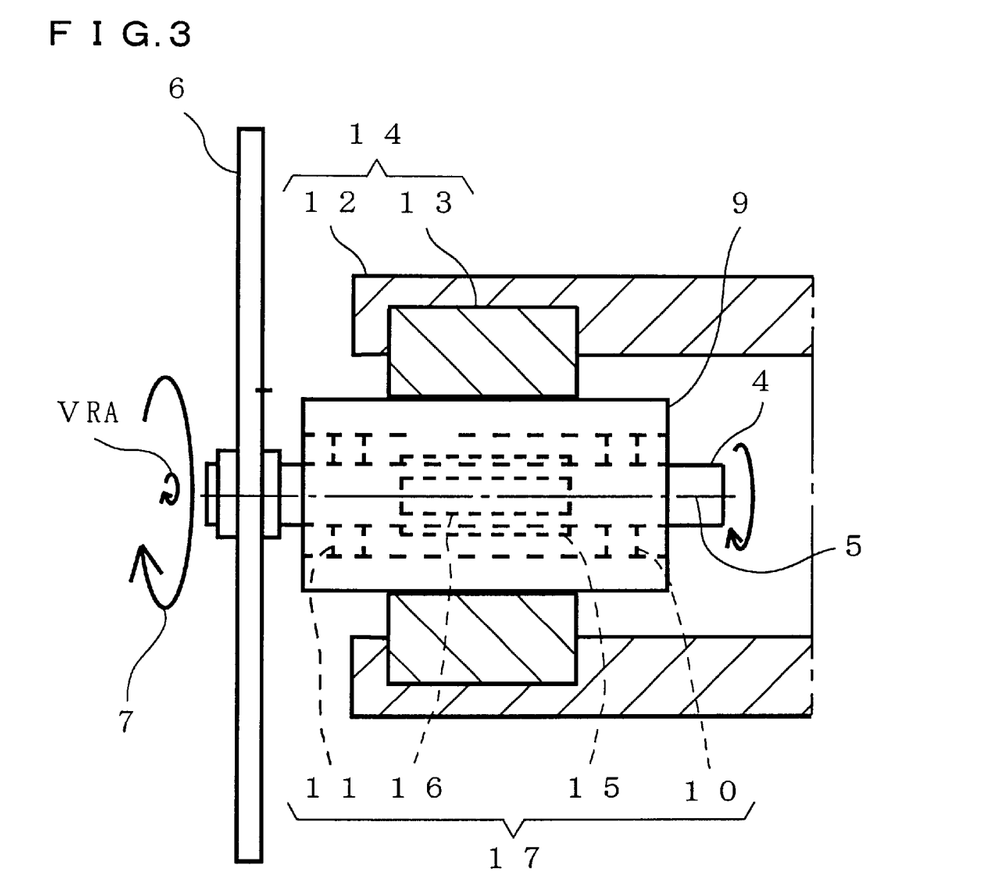
FIG. 3 shows a configuration of the cutting apparatus of the first embodiment, as seen in a partial cross section.

FIG. 3 shows a configuration of the apparatus of the present embodiment, as seen in a partial cross section.

The FIG. 3 apparatus includes a cylinder 9 internally provided with shaft 4, a supporting member 10, 11 provided for example in the form of a bearing and provided internal to cylinder 9 close to opposite ends thereof to support shaft 4, a built-in motor 12 internally provided with cylinder 9, and a shaft 13 for built-in motor 12. Shaft 13 has an internal surface in contact with an external surface of cylinder 9 and cylinder 9 and shaft 13 rotate around their respective centers matching the center around which shaft 4 rotates, i.e., center 5. Built-in motor 12 and shaft 13 together configure a cylinder rotation mechanism 14.

Piezoelectric elements 15, 16 are incorporated in shaft 4 in a vicinity of a portion supported by members 10, 11. When a predetermined level of voltage is applied to piezoelectric elements 15, 16, the piezoelectric elements are displaced by a predetermined amount in directions, respectively, which are substantially orthogonal to center 5 and also substantially orthogonal to each other. Supporting members 10, 11 and piezoelectric elements 15, 16 cooperate to configure a mechanism 17 operating to rotate center 5 of shaft 4. Mechanism 17 rotates center 5 at a predetermined rate VRA with a small radius of rotation rapidly to rotate the rotating cutting edge or the exact blade 6 rapidly with a small radius of rotation apart from its basic rotation around center 5 to oscillate the blade, i.e., oscillate it through rotation.

The FIG. 3 apparatus operates, as described hereinafter.

Initially, the built-in motor's shaft 13 rotates and in accordance therewith cylinder 9 rotates, and furthermore shaft 4, supported in cylinder 9 by members 10, 11, rotates. Thus blade 6 fixed to shaft 4 rotates in direction 7.

A predetermined voltage is then applied to piezoelectric elements 15, 16, respectively to displace piezoelectric elements 15, 16 in directions, respectively, which are substantially orthogonal to center 5 and also substantially orthogonal to each other. Thus, with piezoelectric elements 15, 16 having their respective displacements composited together, center 5 at an end thereof having blade 6 fixed thereto rotates at the predetermined rate VRA with a small radius of rotation rapidly. In other words, the rotative cutting edge or blade 6 itself provides a basic rotation around center 5 and in addition thereto rotates rapidly with a small radius of rotation to provide oscillation.

Herein, piezoelectric elements 15 and 16 have their respective amounts, directions and timings of displacement previously set, as appropriate. Center 5 can thus have an end set to rotate at rate VRA greater than rate VLB of FIG. 1 and having a predetermined ratio to rate VLB of FIG. 1 with a small radius of rotation.

Thus in the apparatus and method of the present embodiment blade 6 rotating fast can still be free from significant working resistance. It can thus cut a workpiece more efficiently and thus have a long life, and substrate 3 after it is cut can also be free of burrs.

Note that while in the above description mechanism 17 employs piezoelectric elements 15 and 16, it may be replaced with any other mechanisms that can rotate center 5 rapidly with a small radius of rotation.

Second Embodiment

The present invention in a second embodiment provides a cutting apparatus and method, as will be described hereinafter with reference to FIGS. 4–6.

While the first embodiment provides a cutting apparatus rotating a center of a shaft of a blade rapidly with a small radius of rotation, the present embodiment provides a cutting apparatus rotating a stage rapidly with a small radius of rotation.

Figure 4:
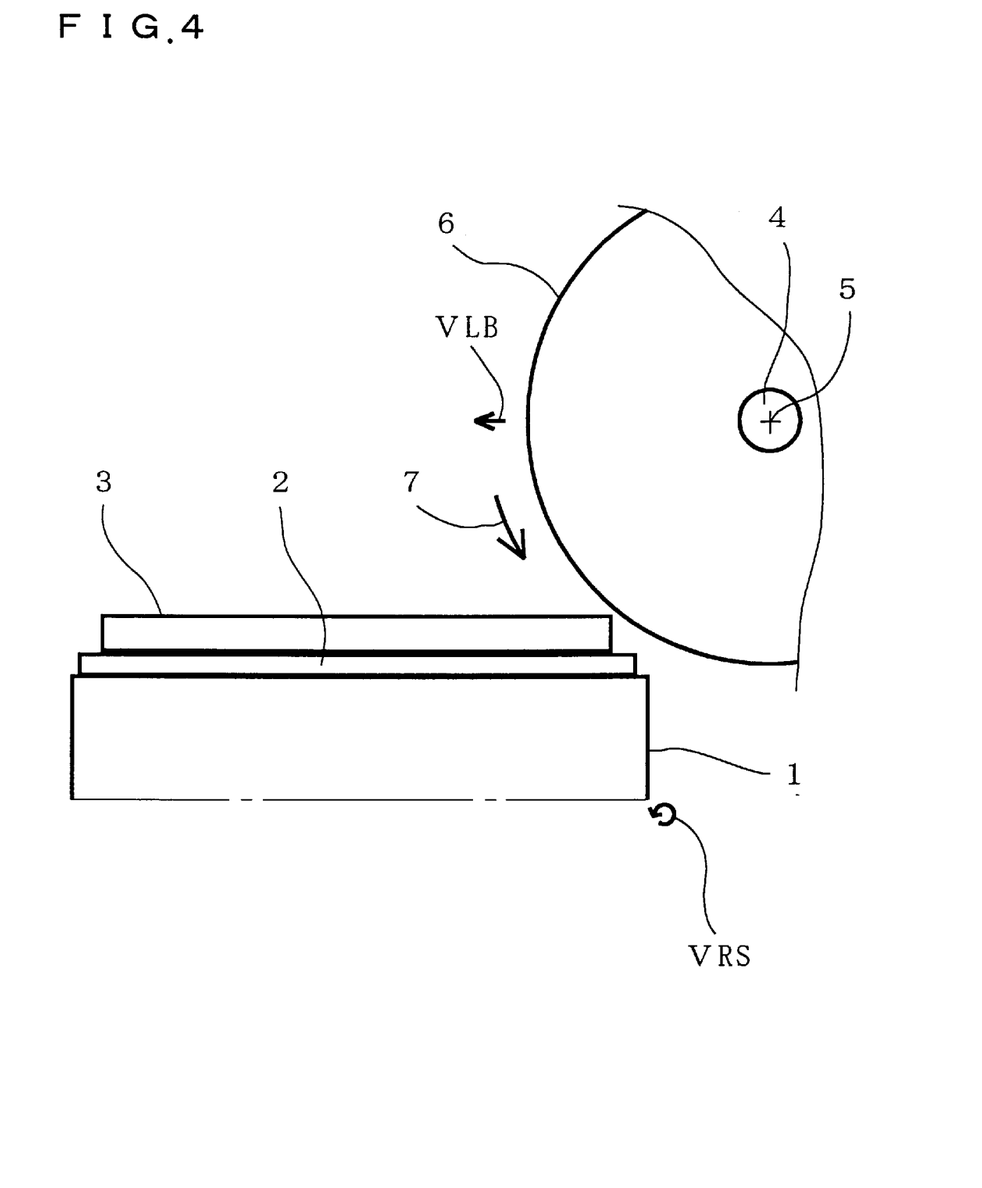
FIG. 4 shows a cutting apparatus of the present invention in a second embodiment, illustrating a main portion with a blade cutting a substrate, as seen in a partial front view.

FIG. 4 shows the apparatus of the present embodiment, illustrating a main portion with a blade cutting a substrate, as seen in a partial front view. Note that the apparatus of the present embodiment, as well as the FIG. 1 apparatus, is provided with drive mechanism DR, although not shown in the figure.

In FIG. 4, stage 1 is revolved by a stage rotation mechanism around a center of a predetermined revolution at a predetermined rate VRS with a small radius of rotation rapidly.

In the present embodiment the apparatus is set to have rate VRS greater in magnitude than rate VLB and also having a predetermined ratio to rate VLB.

The FIG. 4 apparatus operates, as described hereinafter.

Initially, shaft 4 rotates around center 5 in a predetermined direction 7, (counter-clockwise in FIG. 4) and stage 1 also rotates at rate VRS counter-clockwise, as seen in FIG. 1, with a predetermined radius of rotation to provide oscillation, i.e., oscillates through rotation. Thus, blade 6 rotates in direction 7 to allow its periphery or cutting edge to have a peripheral speed, while stage 1 rotates at rate VRS rapidly with a small radius of rotation to provide oscillation.

Then, similarly as in the apparatus of the first embodiment, blade 6 horizontally moves at a predetermined rate VLB leftwards, as seen in FIG. 4, to contact substrate 3 and ultimately cuts substrate 3 from the top to bottom planes from right to left.

Herein to efficiently cut the workpiece the stage is rotated preferably in the same direction as direction 7 (counter-clockwise in FIG. 4). Thus in a vicinity of a location at which blade 6 and substrate 3 contact each other the blade and the substrate move in opposite directions constantly opposite to each other. This can increase the peripheral speed of blade 6 relative to substrate 3 to cut the workpiece more efficiently.

In the present embodiment the apparatus and method is characterized in that stage 1 rotates at rate VRS greater than rate VLB and also having a predetermined ratio to rate VLB.

Furthermore it is characterized in that stage 1 is rotated with a radius of rotation set to have a predetermined value relative to rate VLB and that the stage is rotated in the same direction as direction 7.

For example, with the material(s) of substrate 3 and the magnitude of chips produced therefrom taken into consideration, rate VRS is determined relative to rate VLB, as follows:

If blade 6 advances at a rate VLB of x $\mu$m/rotation, stage 1 is rotated at rate VRS greater than rate VLB and having a predetermined ratio to rate VLB, e.g., a peripheral speed of y $\mu$m while blade 6 rotates once. Furthermore, stage 1 is rotated with a radius or diameter of rotation set to have a predetermined value, for example of a diameter of z $\mu$m, relative to rate VLB.

Stage 1 thus rotates at a predetermined rate VRS with a small radius of rotation rapidly, and blade 6 as it travels a distance repetitively contacts and is disengaged from substrate 3 more frequently. The workpiece being cut thus exerts a reduced working resistance because the workpiece contacts the blade for reduced periods of time and is also out of contact with the blade for certain periods of time.

In the present embodiment the apparatus and method acts, as will be described hereinafter with reference to FIGS. 5A and 5B.

Figure 5A:
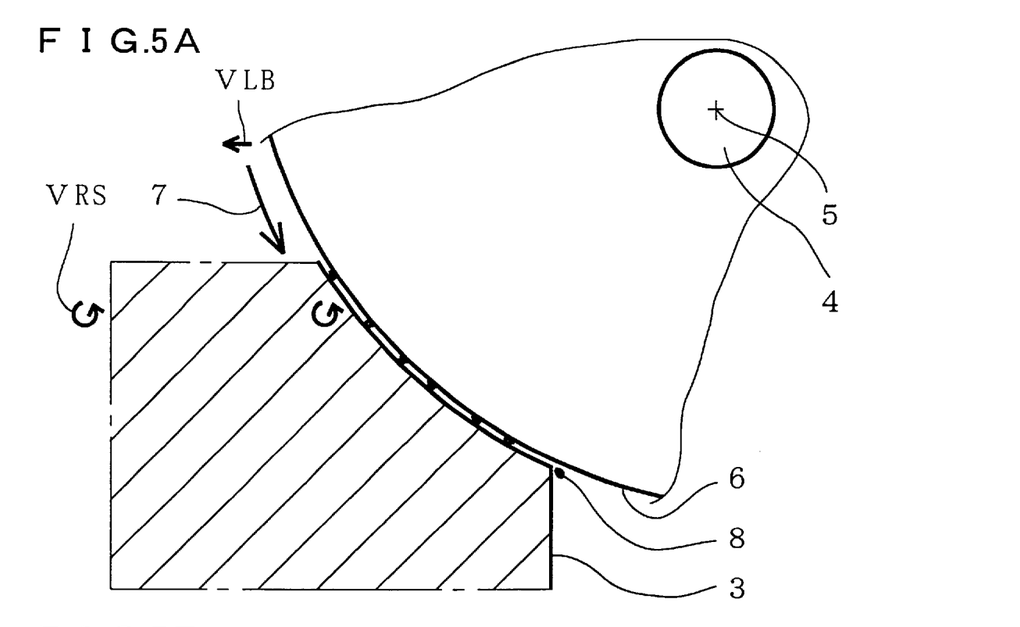
FIGS. 5A and 5B show a cutting apparatus of the present invention in the second embodiment and a method thereof, illustrating how it acts when a blade cutting a substrate is pressed against the substrate and disengaged therefrom, respectively, as seen in a partial cross section.
Figure 5B:
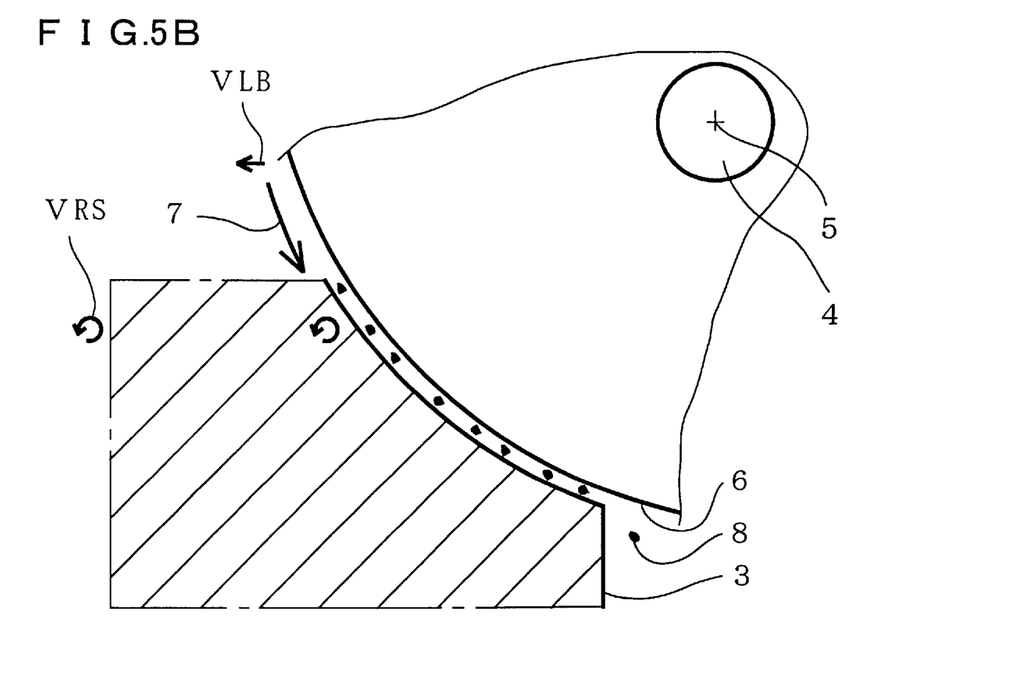

FIGS. 5A and 5B show the apparatus and method of the present embodiment, illustrating how the blade cutting a substrate acts when the blade is pressed against the substrate and disengaged therefrom, respectively, as seen in partial cross section.

As well as the apparatus of FIGS. 2A and 2B, the apparatus of present embodiment, as shown in FIGS. 5A and 5B, first facilitates removing chips 8 from between the cutting edge of blade 6 and a surface of substrate 3. Blade 6 cutting substrate 3 can thus be free from significant working resistance.

Secondly it can intermittently repeat contacting and thus cutting substrate 3 and it can thus be free from significant working resistance.

Thirdly in a vicinity of a location at which blade 6 and substrate 3 contact each other the blade and the substrate can move in opposite directions constantly opposite to each other. Blade 6 can thus have a peripheral speed increased relative to substrate 3 to more efficiently cut the substrate.

The present embodiment provides the apparatus, as will be described hereinafter with reference to FIG. 6.

Figure 6:
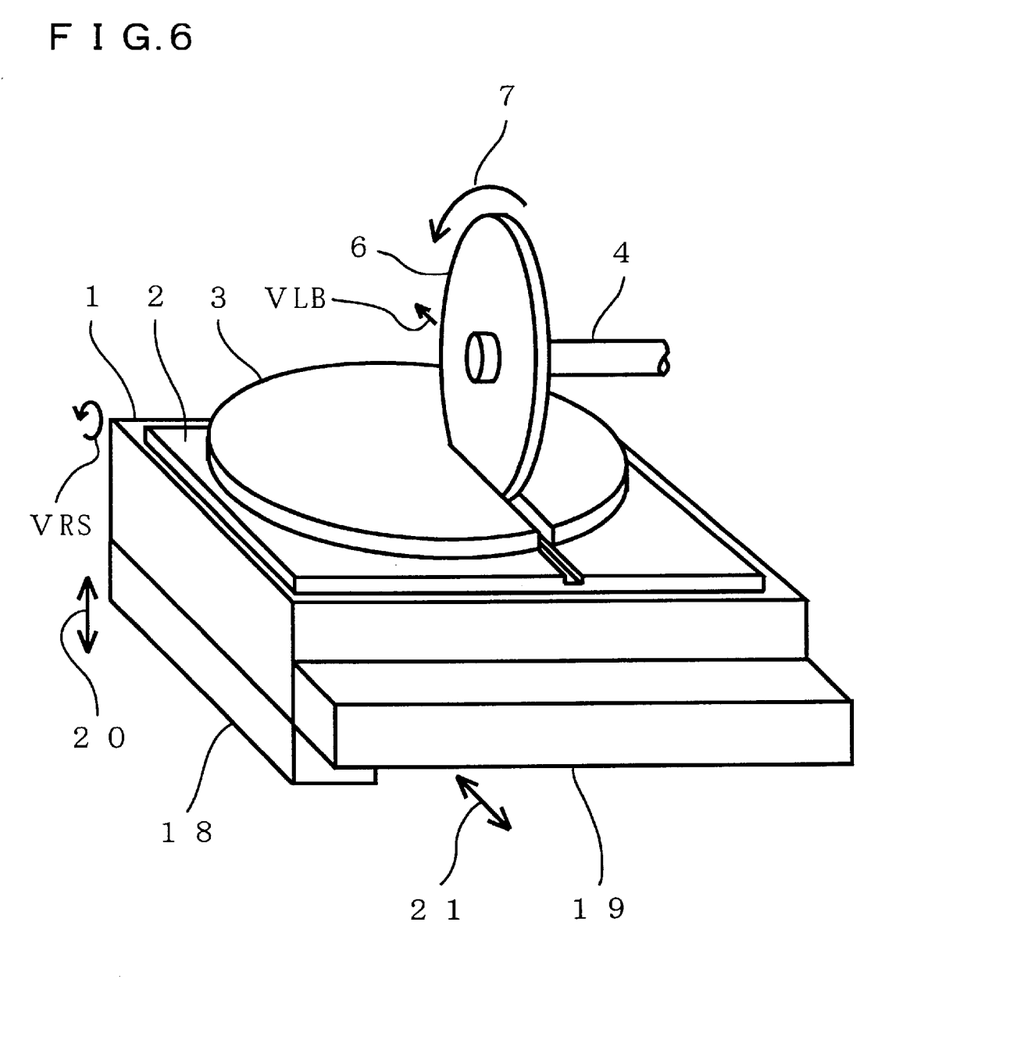
FIG. 6 shows a configuration of the cutting apparatus of the second embodiment, as seen in a perspective view.

FIG. 6 shows a configuration of an apparatus in accordance with the present embodiment, as seen in a perspective view.

The apparatus of the present embodiment, as shown in FIG. 6, includes a vertical micro-motion mechanism 18 and a horizontal micro-motion mechanism 19 respectively formed of a piezoelectric element having a small displacement in a predetermined direction, i.e., vertical and horizontal directions, when a voltage is applied thereto. Furthermore, in the figure, an arrow 20 indicates a direction of a vertical micro-motion indicating a vertical direction in which vertical micro-motion mechanism 18 provides a displacement, and an arrow 21 indicates a direction of a horizontal micro-motion indicating a horizontal direction in which horizontal micro-motion mechanism 19 provides a displacement. That is, directions 20 and 21 are substantially orthogonal to each other.

The FIG. 6 apparatus operates, as follows:

Initially, shaft 4 rotates and in accordance therewith blade 6 fixed to shaft 4 rotates in direction 7. Then for example a predetermined sinusoidal voltage is applied to vertical and horizontal micro-motion mechanisms 18 and 19.

Mechanisms 18 and 19 thus have their respective small displacements in directions 20 and 21, respectively, and then return to their respective, initial positions, and repeat their respective such movements to provide a reciprocating micro-motion. As mechanisms 18 and 19 have their displacements composited together, the exact stage 1 rotates at a predetermined rate VRS with a small radius of rotation rapidly to provide oscillation.

Herein mechanisms 18 and 19 have their respective amounts, directions and timings of displacement previously set, as appropriate. The exact stage 1 can thus be set to rotate at rate VRS greater than rate VLB and having a predetermined ratio to rate VLB with a small radius of rotation.

Thus in the apparatus of the present embodiment as well as that of the first embodiment blade 6 rotated faster to cut substrate 3 can still be free from significant working resistance. In addition, blade 6 can have a peripheral speed increased relative to substrate 3 and thus cut the substrate more efficiently.

Furthermore, with the reduced working resistance, blade 6 hardly has its surface increased in temperature. Blade 6 can thus have a long life.

Furthermore, the reduced working resistance results in a cut substrate 3 free of significant burrs. Thus, if a semiconductor chip formed by cutting a silicon substrate is used to fabricate a chip size package (CSP), the semiconductor chip can be mounted snugly and the CSP can thus be enhanced in reliability.

Note that while in the present embodiment the apparatus uses vertical and horizontal micro-motion mechanisms 18 and 19 in the form of a piezoelectric element, the apparatus is not limited thereto and it may use any other mechanisms that can provide stage 1 with mutually orthogonal, reciprocating micro-motions to rotate stage 1 rapidly with a small radius of rotation.

Note that in each of the above embodiments the apparatus is described as having blade 6 horizontally moved to bring blade 6 into contact with substrate 3 fixed on stage 1. Alternatively, stage 1 may be moved horizontally. Furthermore, stage 1 and blade 6 may both be moved in appropriate directions, respectively, at appropriate rates, respectively, to relatively move substrate 3 and blade 6 to bring them into contact with each other.

Furthermore, stage 1 and blade 6 may rotate in a perfect circle to provide oscillation and or they may rotate in an ellipse to provide oscillation. Furthermore, one of the displacements in the two directions may be stopped to allow stage 1 or blade 6 to provide a mono-directional, reciprocating micro-motion and resultant oscillation through rotation, i.e., a simple harmonic motion to cut substrate 3.

In any of the above cases, substrate 3 and blade 6 that rotates can intermittently contact each other to cut substrate 3 efficiently.

Furthermore while in the above description direction 7 is a downward direction it may be an upward direction. Furthermore, while in the above description direction 7 having a center corresponding to center 5 is identical to a direction in which center 5 or stage 1 rotates, the blade and center 5 or stage 1 may rotate in opposite directions depending on the material(s) of the workpiece of interest.

Furthermore, while in the above description the present invention is applied to completely cutting substrate 3 in the direction of the thickness of the substrate, the present invention is also applicable to incompletely or partially cutting substrate 3.

Furthermore, substrate 3 serving as a workpiece is not limited to a silicon substrate and it may for example be a silicon on insulator (SOI) substrate, a compound semiconductor substrate, a glass substrate, a ceramic substrate, a metal based substrate, stone, jewelry, and crystalloid.

Furthermore, while in the above description the exact center 5 of the shaft of blade 6 or the exact stage 1 is rotated rapidly with a small radius of rotation to provide oscillation, alternatively center 5 and stage 1 may simultaneously be rotated rapidly with a small radius rotation to provide oscillation. This also allows blade 6 to have its cutting edge brought into contact with and disengaged from substrate 3 to cut substrate 3 and remove chips 8 repetitively.

While the present invention uses blade 6 in the form of a disc, the present invention is alternatively applicable for example when a tool does not rotate but linearly moves to cut a workpiece. This application can also provide a reduced working resistance and facilitate removing chips. Thus the workpiece can be cut more efficiently and be also free of significant burrs. Furthermore, frictional heat generated at the tool can readily dissipate and the tool can thus have a long life.

In the apparatus and method of the first and second embodiments, a blade rotating around a center of a shaft and a workpiece move at a relative speed of movement, and, with the shaft's center itself rotating at a rate greater than the relative speed of movement, the blade and the workpiece intermittently contact each other. Furthermore, a stage rotates at a rate greater than the relative speed of movement, and the workpiece on the stage and the blade intermittently contact each other. The blade cutting the workpiece can thus be free from significant working resistance. The workpiece can thus be cut more efficiently and after it is cut can be free of significant burrs. Furthermore, when the blade is out of contact with the workpiece, frictional heat generated in cutting the workpiece can dissipate from the blade. The blade can thus have a long life.

Thus the present invention can achieve a superior, practical effect that provides a cutting apparatus and method capable of providing enhanced working efficiency, reducing burrs and also providing a blade with a longer life.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of cutting a workpiece using a blade, comprising the steps:
   a) fixing said workpiece to a fixture device;
   b) rotating said blade on a shaft about a shaft's center of said shaft;
   c) moving at least one of said blade and said workpiece at a predetermined relative rate of advancing movement to advance said blade relative to said workpiece;
   d) oscillating at least one selected element among said shaft's center and said fixture device in an oscillation plane at a predetermined rate of oscillation greater than said relative rate of advancing movement, by piezoelectrically generating and applying an oscillation to said at least one selected element, wherein said oscillating comprises revolving said at least one selected element around a predetermined center of revolution at a predetermined rate of revolution with a predetermined radius of revolution in a predetermined direction of revolution or moving said at least one selected element in a predetermined ellipse; and
   e) while performing said steps b), c) and d), bringing said blade and said workpiece into contact with one other to cut said workpiece with said blade along a cutting plane corresponding to said oscillation plane.

2. The method according to claim 1, wherein said selected element comprises said shaft's center.

3. The method according to claim 2, wherein said oscillating comprises said revolving around said predetermined center of revolution.

4. The method according to claim 3, wherein said predetermined direction of revolution is the same as a direction of rotation in which said blade is rotated.

5. The method according to claim 3, wherein said predetermined direction of revolution is opposite a direction of rotation in which said blade is rotated.

6. The method according to claim 2, wherein said oscillating comprises said moving in a predetermined ellipse.

7. The method according to claim 1, wherein said selected element comprises said fixture means.

8. The method according to claim 7, wherein said oscillating comprises said revolving around said predetermined center of revolution.

9. The method according to claim 8, wherein said predetermined direction of revolution is the same as a direction of rotation in which said blade is rotated.

10. The method according to claim 8, wherein said predetermined direction of revolution is opposite a direction of rotation in which said blade is rotated.

11. The method according to claim 7, wherein said oscillating comprises said moving in a predetermined ellipse.

12. A cutting apparatus comprising:
    fixture means for fixing a workpiece thereto;
    cutting means for cutting said workpiece, including a shaft and a blade adapted to rotate about a shaft's center of said shaft for cutting said workpiece with said blade along a cutting plane;
    drive means for moving at least one of said blade and said workpiece relative to one another at a predetermined relative rate of advancing movement to allow said blade and said workpiece to contact one another and to advance said blade relative to said workpiece; and
    oscillation means for oscillating at least one of said shaft's center and said fixture means at a predetermined rate of oscillation in said cutting plane;
    wherein said rate of oscillation is greater than said relative rate of advancing movement; and
    wherein said oscillation means comprises means for providing and superimposing a first reciprocating oscillation in a first direction and a second reciprocating oscillation in a second direction different from said first direction to form a compound oscillation for oscillating said at least one of said shaft's center and said fixture means.

13. The cutting apparatus according to claim 12, wherein said oscillation means is for oscillating said shaft's center.

14. The cutting apparatus according to claim 12, wherein said oscillation means is for oscillating said fixture means.

15. A cutting apparatus comprising:
    fixture means for fixing a workpiece thereto;
    cutting means for cutting said workpiece, including a shaft and a blade adapted to rotate about a shaft's center of said shaft for cutting said workpiece with said blade along a cutting plane;
    drive means for moving at least one of said blade and said workpiece relative to one another at a predetermined relative rate of advancing movement to allow said blade and said workpiece to contact one another and to advance said blade relative to said workpiece; and
    oscillation means including at least one piezoelectric element for piezoelectrically generating an oscillation for oscillating at least one selected element among said shaft's center and said fixture means at a predetermined rate of oscillation in an oscillation plane corresponding to said cutting plane;
    wherein said rate of oscillation is greater than said relative rate of advancing movement; and
    wherein said oscillation means comprises means for revolving said at least one selected element around a predetermined center of revolution at a predetermined rate of revolution with a predetermined radius of revolution in a predetermined direction of revolution as said oscillating, or means for moving said at least one selected element in a predetermined ellipse as said oscillating.

16. The cutting apparatus according to claim 15, wherein said selected element comprises said shaft's center.

17. The cutting apparatus according to claim 16, wherein said oscillation means comprises said means for revolving around said predetermined center of revolution.

18. The cutting apparatus according to claim 17, wherein said predetermined direction of revolution is the same as a direction of rotation in which said blade is adapted to rotate.

19. The cutting apparatus according to claim 17, wherein said predetermined direction of revolution is opposite a direction of rotation in which said blade is adapted to rotate.

20. The cutting apparatus according to claim 16, wherein said oscillation means comprises said means for moving in a predetermined ellipse.

21. The cutting apparatus according to claim 15, wherein said selected element comprises said fixture means.

22. The cutting apparatus according to claim 21, wherein said oscillation means comprises said means for revolving around said predetermined center of revolution.

23. The cutting apparatus according to claim 22, wherein said predetermined direction of revolution is the same as a direction of rotation in which said blade is adapted to rotate.

24. The cutting apparatus according to claim 22, wherein said predetermined direction of revolution is opposite a direction of rotation in which said blade is adapted to rotate.

25. The cutting apparatus according to claim 21, wherein said oscillation means comprises said means for moving in a predetermined ellipse.

* * * * *